United States Patent
Condict et al.

(10) Patent No.: US 9,048,862 B2
(45) Date of Patent: Jun. 2, 2015

(54) SYSTEMS AND METHODS FOR SELECTING DATA COMPRESSION FOR STORAGE DATA IN A STORAGE SYSTEM

(75) Inventors: Michael N. Condict, Hurdle Mills, NC (US); Fei Xie, Raleigh, NC (US); Sandip Shete, Morrisville, NC (US)

(73) Assignee: NetApp, Inc., Sunnyvale, CA (US)

( * ) Notice: Subject to any disclaimer, the term of this patent is extended or adjusted under 35 U.S.C. 154(b) by 686 days.

(21) Appl. No.: 13/444,250

(22) Filed: Apr. 11, 2012

(65) Prior Publication Data

US 2013/0275396 A1  Oct. 17, 2013

(51) Int. Cl.
*G06F 17/30* (2006.01)
*H03M 7/30* (2006.01)

(52) U.S. Cl.
CPC ............... *H03M 7/607* (2013.01); *H03M 7/30* (2013.01)

(58) Field of Classification Search
CPC .................... G06F 17/30153; G06F 17/30091; G06F 17/30135
USPC .......................................................... 707/693
See application file for complete search history.

(56) References Cited

U.S. PATENT DOCUMENTS

| | | | |
|---|---|---|---|
| 8,478,731 B1 * | 7/2013 | Throop et al. ................. | 707/693 |
| 8,751,463 B1 * | 6/2014 | Chamness ...................... | 707/693 |
| 2007/0233693 A1 * | 10/2007 | Baxter et al. .................... | 707/10 |
| 2013/0006948 A1 * | 1/2013 | Shmueli ......................... | 707/693 |

* cited by examiner

*Primary Examiner* — Cam-Y Truong
(74) *Attorney, Agent, or Firm* — LeClairRyan, a Professional Corporation

(57) ABSTRACT

Storage systems and methods to improve space saving from data compression by providing a plurality of compression processes, and optionally, one or more parameters for controlling operation of the compression processes and selecting from the plurality of compression processes and the parameters to satisfy resource limits, such as CPU usage and memory usage. In one embodiment, the methods takes into account the content-type, such as text file or video file, and select the compression process and parameters that provide the greatest space savings for that content type while also remaining within a defined resource-usage limit.

12 Claims, 12 Drawing Sheets

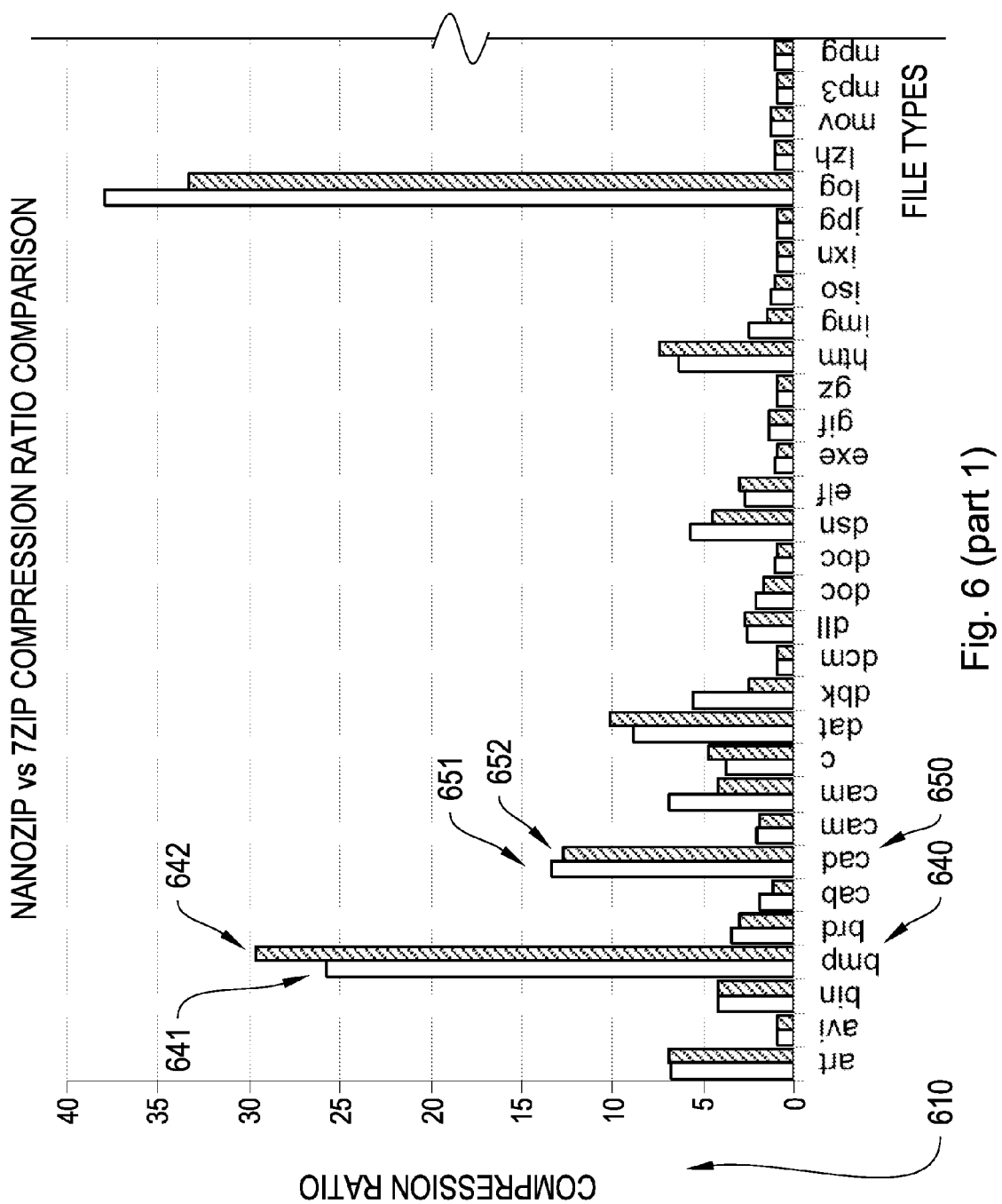
Fig. 6 (part 1)

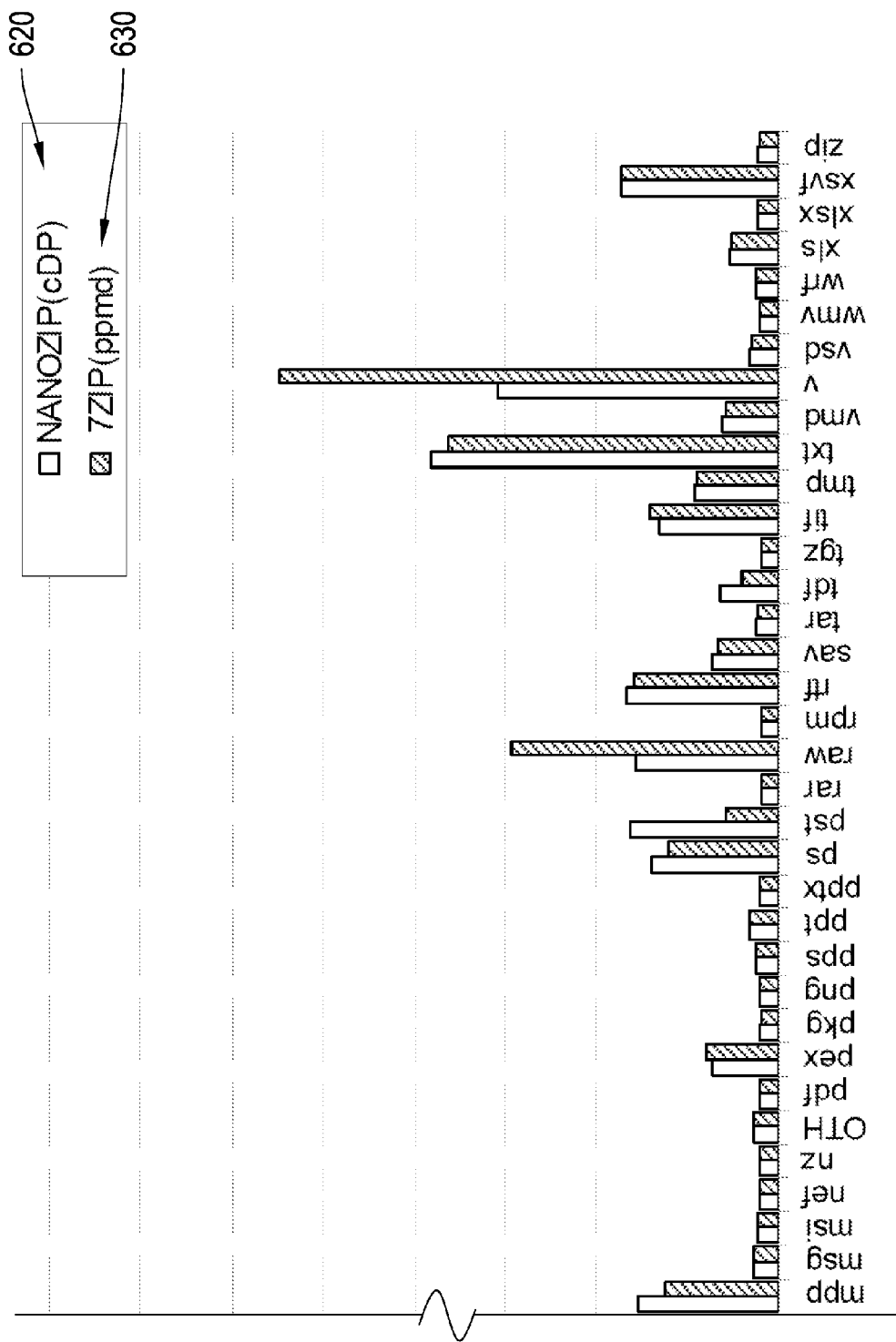
Fig. 6 (part 2)

US 9,048,862 B2

SYSTEMS AND METHODS FOR SELECTING DATA COMPRESSION FOR STORAGE DATA IN A STORAGE SYSTEM

FIELD OF THE INVENTION

The systems and methods described herein relate to storage systems, and more particularly, to storage systems that apply data compression to conserve storage capacity.

BACKGROUND

Today, there exist storage systems that use data compression processes to reduce the size of data files being stored on the system and thereby increase the effective data capacity of the storage system. Such existing storage systems can reduce the physical capacity required to store data within primary, secondary, and/or archive storage. Moreover, these systems may compress files, virtual local disks, logical units and other storage entities. In each case, the storage systems achieve this data size reduction by use of a compression process.

A compression process is typically computer code which, when applied to a storage object to be stored on a storage medium, results in the storage object having a smaller, or compressed, size. A compression process is typically a computationally intense process that analyzes and alters the raw data of the storage object. Compression processes may be "lossy", meaning that some information that is considered superfluous is cut out during compression, or "lossless", meaning that all information in the object is retained, while still resulting in a smaller size. Lossy compression is most often used for image, video and audio file compression, and basic lossy compression methodologies include; the removal of inaudible frequency ranges from audio recordings, the reduction of the color spectrum of images by averaging out color transitions, and the comparison of frame transitions in video, where only changes in pixel blocks between frames are saved.

Lossless compression processes are commonly used for the compression of data that is characterized by the fact that missing parts would noticeably degrade the dataset, or render it indecipherable, such as for text files. Methodology for lossless text file compression includes statistical modeling algorithms that track repeated occurrences of data, and refer back to a single copy of the repeated data, rather than saving multiple copies of the same data during compression.

A large number of compression processes exist and different compression processes provide different degrees and speeds of compression. Compression processes can be compared using metrics, with the most common comparison made using a compression ratio (CR); which is an estimate of the expected ratio of uncompressed to compressed file size achieved for a typical file. Although compression ratios can be inexact predictors of the compression that will be achieved for a particular file, they generally show that to achieve higher compression ratios, compression processes that take more computational resources are required, where computational resources may include processing time, or memory. As a result, compression processes are also evaluated based on the data compression and decompression speeds they can achieve, for a given compression ratio. Additionally, other metrics may include the memory demands of a given compression process, which refers to the amount of random access memory (RAM) that is required to process the data as the compression process is running Again, a compression process with a higher compression ratio may generally require more RAM and CPU power to process the data.

Typically existing storage systems use a single compression process, and the algorithm used depends on the decompression data rate required to meet the fastest decompression speeds for acceptable data retrieval. Thus, these existing systems are built around a worst-case use model and this shapes the overall system compression performance. Some other existing systems, such as the systems disclosed in US Patent Application 2010/0058002 A1 entitled System and Method for File System Level Compression Using Compression Group Descriptors and assigned to the assignee hereof, apply different compression techniques based on the type of data file being compressed. As described in this publication, the storage system will recognize the file type, typically by examining the file name extension, and will apply to that file a compression process that has been pre-defined by the storage system engineers, as the appropriate compression process to apply to that file type. Although this type of storage system can achieve greater file compression, the rate of data compression can be costly to system performance and delay read and write operations.

Thus, although existing data storage that use data compression can work well, there exists a need for a more efficient method of using data compression to improve available storage capacity.

SUMMARY OF THE INVENTION

The systems and methods described herein include, among other things, storage systems having compression selection processes that enable selection of a compression process from a catalog of available compression processes, based, at least in part, on a data compression and/or decompression rate limit for read and write operations on the storage system. Additionally and optionally, the systems and method described herein may also select the compression process based at least in part on file type, and system resource limits. In one particular embodiment, the systems and methods described herein determine the compression rate of plural compression processes by selecting a compression process and applying that selected process to a set of test data, using a variety of compression process input parameters. The testing protocol stores the test results in, in one embodiment, a lookup table, which may include, among other things, the compression ratio, and data compression and decompression rates achieved by the compression process tested, in addition to the compression process input parameters used. In subsequent use, a compression processor receives real data to be compressed by the system, and a limit processor records externally-specified parameters that limit the algorithm selection, such as the minimum acceptable data compression and depression speeds. A compression processor selector chooses the appropriate compression process from the lookup table, subject to the selection criteria specified by the limit processor, and a data processor implements the compression process on the real data.

More particularly, the systems and methods described herein include, in one aspect, methods for storing data in a compressed format on a storage device. These methods may include providing a lookup table for storing a plurality of pointers to respective compression processes, and for storing a compression ratio and a data rate for each respective compression process. The method may receive, by a data processor, a data file having an uncompressed file size and a limit processor may receive a time limit for compression and/or a time limit for decompression, associated with the data file, and calculate a data rate to achieve compression and decompression of the data file, using the uncompressed file size and the time limits for compression and decompression. The method may then select a baseline compression process from the lookup table as a function of the calculated data rate and the compression ratios of compression processes achieving the calculated data rate and then compress the data file, using the selected baseline compression process.

Optionally, the method may store for a compression process within the lookup table, one or more operating parameters for adjusting performance of the respective compression process and further may receive, by the limit processor, a memory limit or a CPU usage limit, associated with a file compression or decompression operation, and store these limits as operating parameters. In one particular embodiment, receiving a time limit for compression includes receiving a service level objective parameter representative of a speed for writing data on to the storage device.

Further optionally, the method may, when selecting a compression process, identify a file type associated with the data file based at least in part on a file suffix associated with the data file or a file header within the data file and determine whether to alter the baseline compression process for the identified file type, such that an alternate compression process is applied to the file. Typically, the method selects a compression process from the lookup table that has a highest compression ratio for the identified file type.

In an optional practice, the method may additionally decompress a stored data file, compressed using a sub-optimal compression process prior to submission to the data processor, and select the best available compression process from the lookup table, and re-compress the data.

In another aspect, there are provided compression process selection systems having a data processor, for receiving a file to be compressed, and for applying the selected compression process to the file. The system may further have a limit processor for storing a time limit for compression, and optionally, a time limit for decompression, associated with the file, and for calculating minimum acceptable data rates to achieve compression and decompression of the file using the file size and the corresponding time limits for compression and decompression. A compression process selector may select a compression process from a lookup table as a function of the minimum acceptable data rates for the file and the compression ratio of the respective compression process.

The compression process selection system may further have a parameter processor, for extracting from the lookup table settings associated with the selected compression process, and inputting those settings when applying the selected compression process. Further, the data processor may be used to identify a type of file to be compressed or decompressed based on the file suffix or using the file header.

Typically, the compression process selection system applies a compression ratio selection criterion, wherein the compression process selector selects a compression process achieving the highest compression ratio, for a specific file type, from the lookup table.

In some embodiments, the compression process selection system applies the data processor to decompress files presented to the system which were compressed using a sub-optimal compression process, and recompress the files using the best available compression process in the lookup table.

Further, the compression process selection system may be used to define a memory limit for a compression or decompression operation and/or a CPU capacity limit for a compression or decompression operation. The lookup table may include for a respective compression process a plurality of compression rates and associated compression ratios as well as a plurality of compression ratios and a plurality of associated resource limits.

BRIEF DESCRIPTION OF THE DRAWINGS

The systems and methods described herein are set forth in the appended claims. However, for purpose of explanation, several embodiments are set forth in the following figures, which are provided for the purpose of illustration and are not to be deemed limiting in any way.

FIG. 6 depicts test data comparing compression ratios for two compression processes, against a plurality of file types;

DETAILED DESCRIPTION

In the following description, numerous details are set forth for purpose of explanation. However, one of ordinary skill in the art will realize that the embodiments described herein may be practiced without the use of these specific details and that in other instances, well-known structures and devices are shown in block diagram form to not obscure the description with unnecessary detail.

In one embodiment, the systems and methods described herein include, among other things, a compression process selection system that selects a compression process from a catalog of compression processes, based on resource limits placed on the compression process and the expected compression ratio for the selected compression process given those resource limits. The selected compression process may be employed as the baseline compression process for compressing data for that storage system. The resource limits may include, among other things, a data compression and decompression rate limit, memory use limits, CPU demand limits as well as resource constraints or limits placed by the system on the compression process. Thus, in one embodiment, the systems and methods described herein select a compression process as a function of, among other things, available system resources and desired data rates, as compared to other systems that employ a fixed compression process selected based on an industry view of the least resource intensive but sufficiently fast compression process. Further, the systems and methods may optionally select an algorithm suitable for multiple file types, or one optimized for a specific file type. The systems and methods described herein may be employed with storage systems that compress a data file, data block, storage object or other data structures and that store data on different types of storage systems, such as volumes, LUNs, RAIDs or any other data storage device. Further, it will be understood that the systems and methods described herein are described using examples that depict a storage system having a single compression process selection system. However, it will be apparent to those of skill in the art that multiple compression process selection systems may be employed within a data storage system. For example, in certain embodiments the storage system may provide separate compression process selection systems, or separate portions of a compression process system, for compressing data on different types of physical media employed within the storage system environment and having different resource limits. These and other modifications may be employed by those of skill in the art without departing from the scope hereof.

Figure 1A:
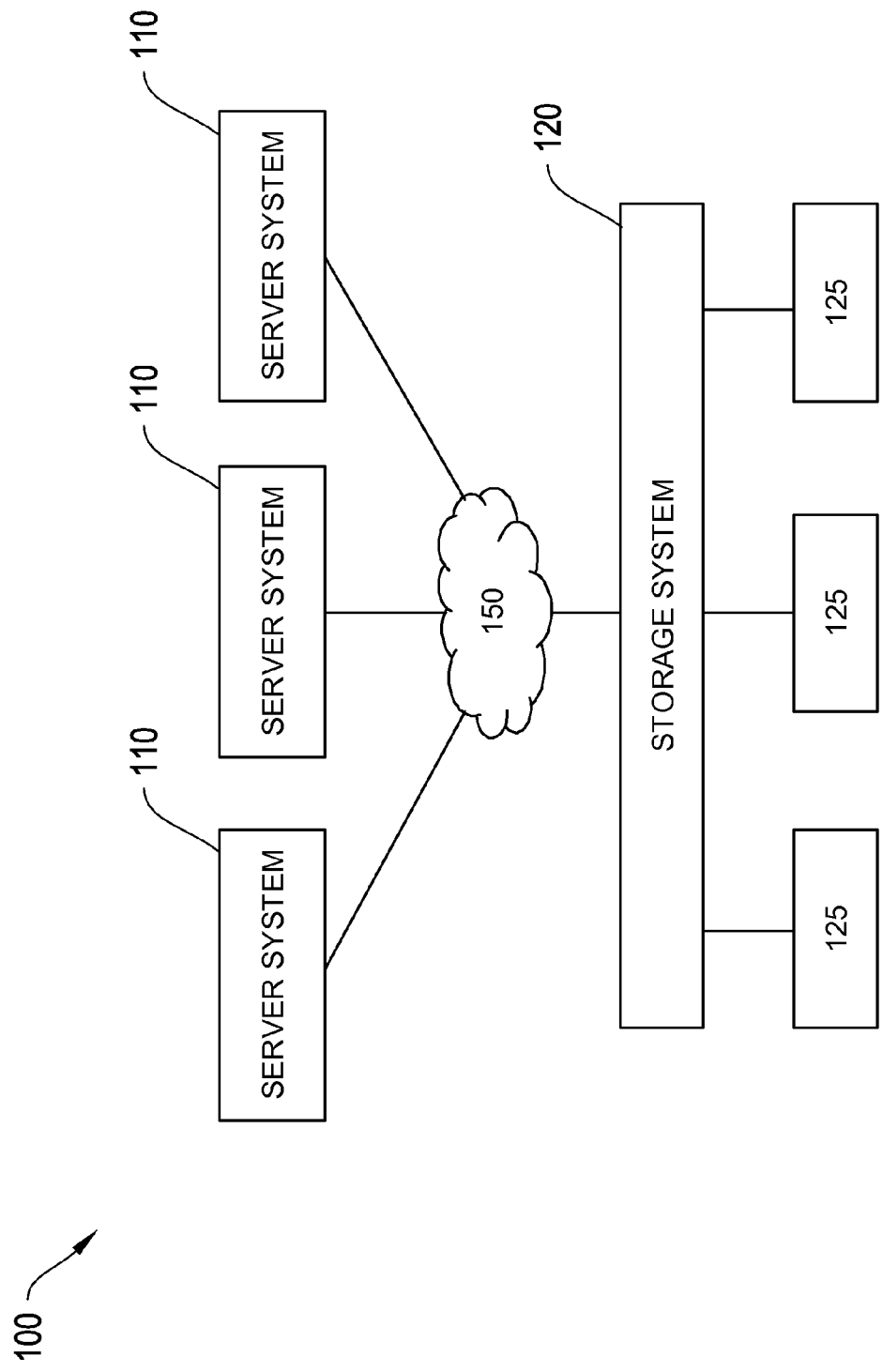
FIGS. 1A and 1B are schematic block diagrams of exemplary storage system environments, in which some embodiments operate.
Figure 1B:
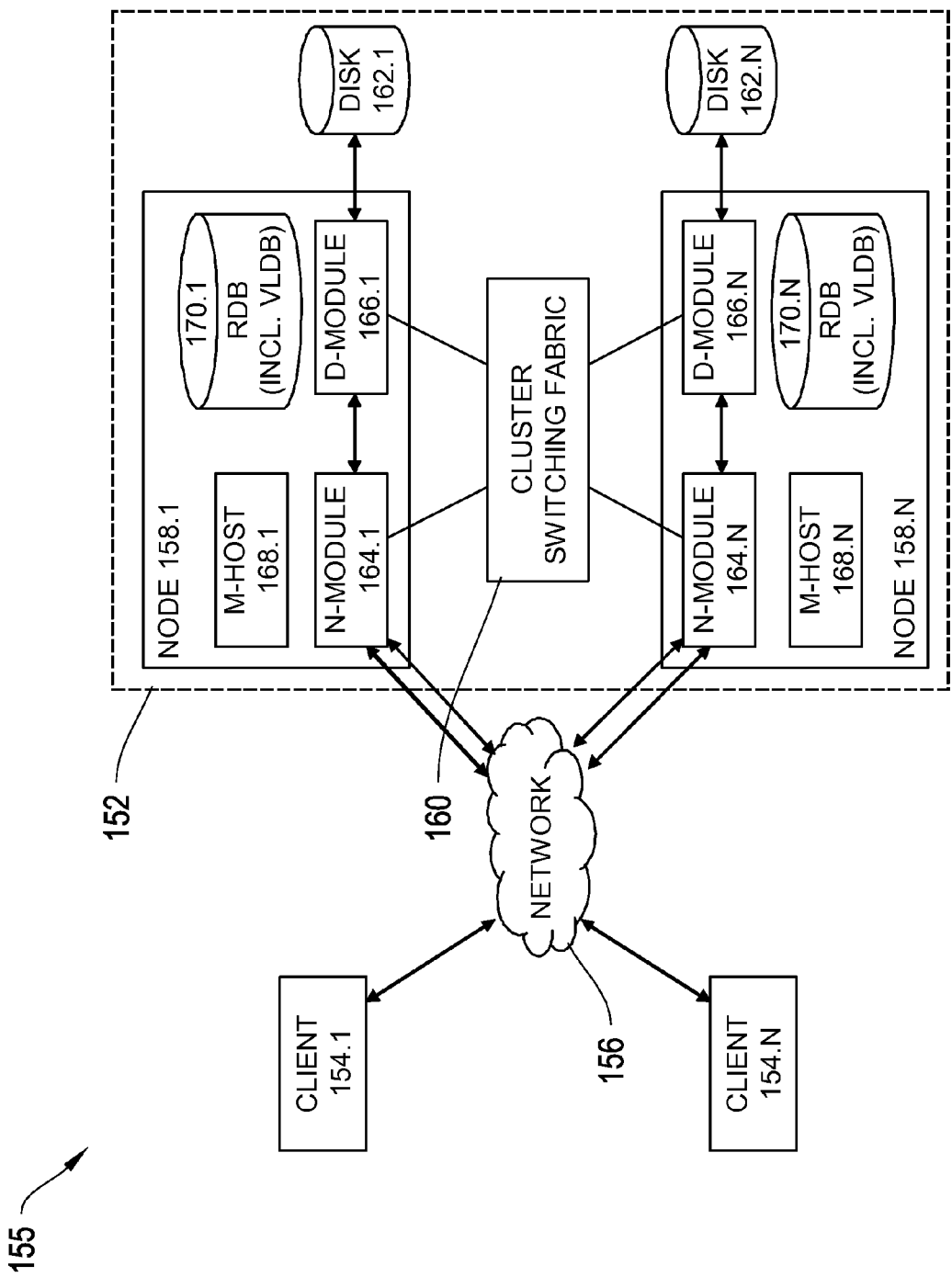

FIGS. 1A and 1B are schematic block diagrams of exemplary storage environments in which some embodiments may operate. In FIG. 1A, the environment 100 has one or more server systems 110 and a storage system 120 (having one or more storage devices 125) that are connected via a connection system 150. The connection system 150 may be a network, such as a Local Area Network (LAN), Wide Area Network (WAN), metropolitan area network (MAN), the Internet, or any other type of network or communication system suitable for transferring information between computer systems.

A server system 110 may have a computer system that employs services of the storage system 120 to store and manage data in the storage devices 125. A server system 110 may execute one or more applications that submit read/write requests for reading/writing data on the storage devices 125. Interaction between a server system 110 and the storage system 120 can enable the provision of storage services. That is, server system 110 may request the services of the storage system 120 (e.g., through read or write requests), and the storage system 120 may perform the requests and return the results of the services requested by the server system 110, by exchanging packets over the connection system 150. The server system 110 may issue access requests (e.g., read or write requests) by issuing packets using file-based access protocols, such as the Common Internet File System (CIFS) protocol or Network File System (NFS) protocol, over the Transmission Control Protocol/Internet Protocol (TCP/IP) when accessing data in the form of files and directories. Alternatively, the server system 110 may issue access requests by issuing packets using block-based access protocols, such as the Fibre Channel Protocol (FCP), or Internet Small Computer System Interface (iSCSI) Storage Area Network (SAN) access, when accessing data in the form of blocks.

The storage system 120 may store data in a set of one or more storage devices 125. As will be described in more detail below, the storage system 120 may select a compression process for reducing the size of storage objects stored on storage devices 125, thereby conserving storage capacity. The storage objects may be any suitable storage object such as a data file, a directory, a data block or any other object capable of storing data. A storage device 125 may be any suitable medium and may include, but is not limited to, writable storage device media, such as magnetic disk devices, video tape, optical, DVD, magnetic tape, any other similar media adapted to store information (including data and parity information), or a semiconductor-based storage device such as a solid-state drive (SSD), or any combination of storage media. These different media types may have different characteristics, such as data retrieval rates and storage rates, and the compression selection processes described herein may in certain embodiments, employ these different characteristics to identify or establish criteria for selecting use in a compression process. For simplicity, the description that follows uses the term "disk", which refers to a magnetic-based hard disk drive storage device, and the term "block", which refers to a subdivision of the total storage space on the hard disk drive. One of ordinary skill in the art will recognize that the description should not be limited by these terms, which can be replaced by any suitable storage device and a corresponding sub-division of storage space for that device, without departing from the spirit of the embodiments.

The storage system 120 may implement a file system that logically organizes the data as a hierarchical structure of directories and files on each storage device 125. Each file may be a set of disk blocks configured to store data, whereas each directory may be a specially-formatted file in which information about other files and directories are stored. A disk block of a file is typically a fixed-sized amount of data that comprises the smallest amount of storage space that may be accessed (read or written) on a storage device 125. The block may vary widely in data size (e.g., 1 byte, 4-kilobytes (KB), 8 KB, etc.). In some embodiments, the file system organizes file data by using inode data structures (alternatively known as file node data structures, or buffer trees) to represent the files in the file system.

FIG. 1B depicts a network data storage environment, which can represent a more detailed view of the environment in FIG. 1A. The environment 155 includes a plurality of client systems 154 (154.1-154.M), a clustered storage server system 152, and a computer network 156 connecting the client systems 154 and the clustered storage server system 152. As shown in FIG. 1B, the clustered storage server system 152 includes a plurality of server nodes 158 (158.1-158.N), a cluster switching fabric 160, and a plurality of mass storage devices 162 (162.1-162.N), which can be disks, as henceforth assumed here to facilitate description. Alternatively, some or all of the mass storage devices 162 can be other types of storage, such as flash memory, SSDs, tape storage, etc.

Each of the nodes 158 is configured to include several modules, including an N-module 164, a D-module 166, and an M-host 168 (each of which may be implemented by using a separate software module) and an instance of, for example, a replicated database (RDB) 170. Specifically, node 158.1 includes an N-module 164.1, a D-module 166.1, and an M-host 168.1; node 158.N includes an N-module 164.N, a D-module 166.N, and an M-host 168.N; and so forth. The N-modules 164.1-164.M include functionality that enables nodes 158.1-158.N, respectively, to connect to one or more of the client systems 154 over the network 156, while the D-modules 166.1-166.N provide access to the data stored on the disks 162.1-162.N, respectively. The M-hosts 168 provide management functions for the clustered storage server system 152. Accordingly, each of the server nodes 158 in the clustered storage server arrangement provides the functionality of a storage server.

FIG. 1B illustrates that the RDB 170 is a database that is replicated throughout the cluster, i.e., each node 158 includes an instance of the RDB 170. The various instances of the RDB 170 are updated regularly to bring them into synchronization with each other. The RDB 170 provides cluster-wide storage of various information used by all of the nodes 158, including a volume location database (VLDB) (not shown). The VLDB is a database that indicates the location within the cluster of each volume in the cluster (i.e., the owning D-module 166 for each volume) and is used by the N-modules 164 to identify the appropriate D-module 166 for any given volume to which access is requested.

The nodes 158 are interconnected by a cluster switching fabric 160, which can be embodied as a Gigabit Ethernet switch, for example. The N-modules 164 and D-modules 166 cooperate to provide a highly-scalable, distributed storage system architecture of a clustered computing environment implementing exemplary embodiments of the present invention. Note that while there is shown an equal number of N-modules and D-modules in FIG. 1B, there may be differing numbers of N-modules and/or D-modules in accordance with various embodiments of the technique described here. For example, there need not be a one-to-one correspondence between the N-modules and D-modules. As such, the description of a node 158 comprising one N-module and one D-module should be understood to be illustrative only. Further, it will be understood that the client systems 154 (154.1-154.M) can also act as nodes and include data memory for storing some or all of the data set being maintained by the storage system.

Figure 2:
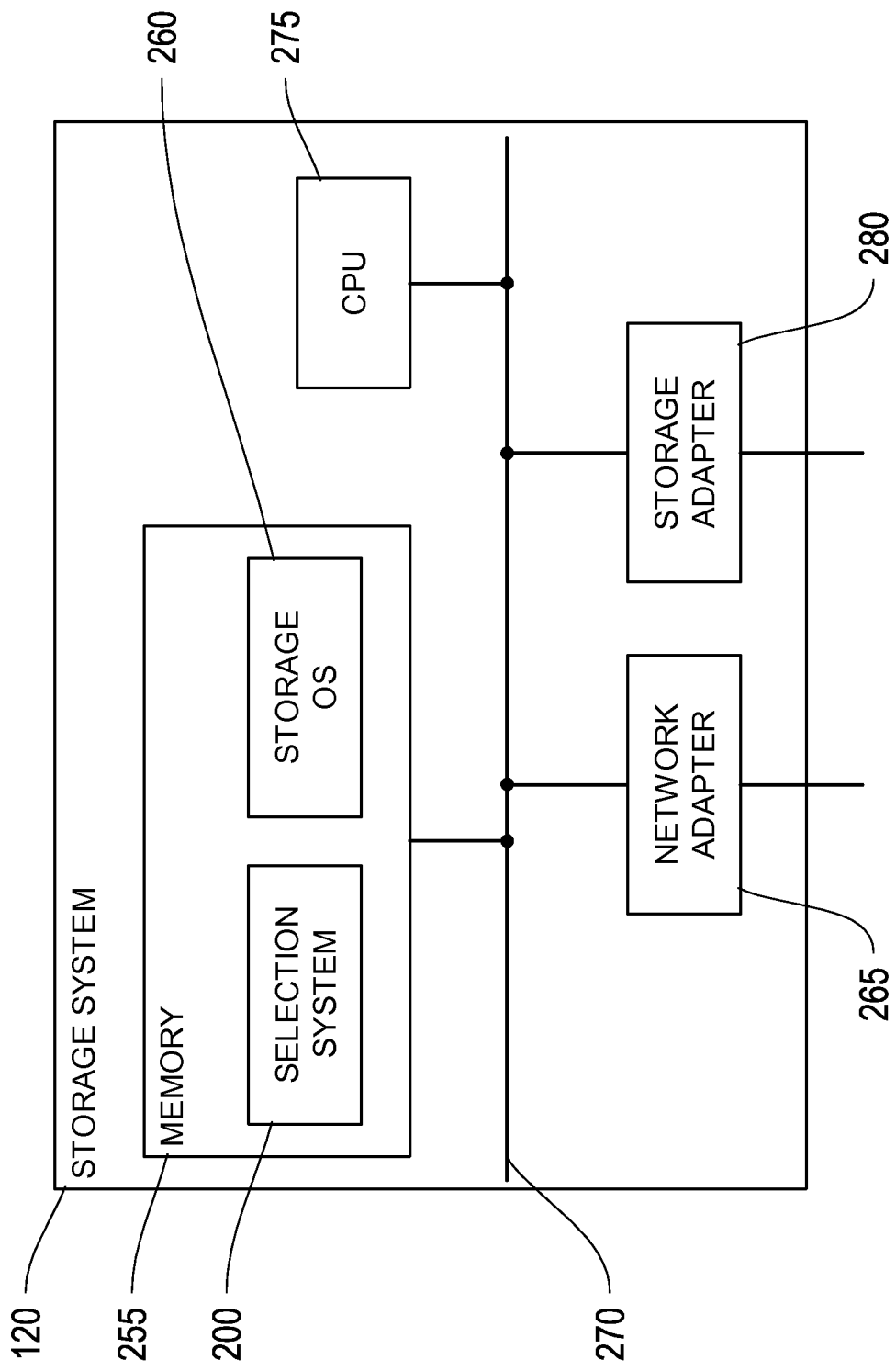
FIG. 2 is a schematic block diagram of an exemplary storage system, as described herein for use in the storage system environment of FIG. 1.

FIG. 2 depicts a schematic block diagram of an exemplary storage system 120 that may be employed in the storage system environment of FIG. 1. Those skilled in the art will understand that the embodiments described herein may apply to any type of special-purpose computer (e.g., storage system) or general-purpose computer, including a standalone computer, embodied or not embodied as a storage system. To that end, storage system 120 can be broadly, and alternatively, referred to as a computer system. Moreover, the teachings of the embodiments described herein can be adapted to a variety of storage system architectures including, but not limited to, a network-attached storage environment, and a storage area network and disk assembly directly-attached to a server computer. The term "storage system" should, therefore, be taken broadly to include such arrangements.

The storage system 120 includes a network adapter 265, a central processing unit (CPU) 275, a memory 255, a storage operating system 260 (otherwise referred to as storage OS 260), a selection system 200, and a storage adapter 280 interconnected by a system bus 270. The network adapter 265 comprises the mechanical, electrical and signaling circuitry needed to connect the storage system 120 to a server system 110 over a computer network 150. The storage system 120 may include one or more network adapters 265. A network adapter 265 has a unique IP address and may reference data access ports for server systems 110 to access the storage system 120 (where the network adapter 265 accepts read/write access requests from the server systems 110 in the form of data packets).

The memory 255 comprises storage locations that are addressable by the CPU 275 and adapters for storing software program code and data. The memory 255 may comprise a form of random access memory (RAM) that is generally cleared by a power cycle or other reboot operation (e.g., it is a "volatile" memory). In other embodiments, however, the memory 255 may be a non-volatile memory that does not require power to maintain information. The CPU 275 and adapters may, in turn, comprise processing elements and/or logic circuitry configured to execute the software code and manipulate the data stored in the memory 255.

The CPU 275 may be made up of one or more processing cores, and execute a storage operating system application 260 of the storage system 120 that functionally organizes the storage system by, inter alia, invoking storage operations in support of a file service implemented by the storage system 120. In some embodiments, the storage operating system 260 comprises a plurality of software layers, which are executed by the CPU 275.

The software modules, software layers, or threads described herein may comprise firmware, software, hardware, or any combination thereof that is configured to perform the processes described herein. For example, the storage operating system may comprise a storage operating system engine comprising firmware or software and hardware configured to perform embodiments described herein. Portions of the storage operating system 260 are typically resident in memory 255, however various computer readable media may be used for storing and executing program instructions pertaining to the storage operating system 255.

In some embodiments, a selection system 200 is also resident in memory 255. This selection system 200 may be used to apply an appropriate compression process to data received by the storage system 120 before being passed to a storage device 125. In one embodiment, the storage system 200 may have a lookup table that stores a set of pointers to a group of different compression processes. The storage system 200 will select a compression process to use as a baseline compression process and this baseline compression process will be the compression process employed by the storage system 200 to compress storage objects being stored on the devices 125. The storage system 200 selects the baseline compression process sorting the compression processes in the lookup table according to certain resource limits that will constrain the operation of the compression process and according to the compression ratios provided by the respective compression processes. In certain embodiments, the baseline compression process can be the default compression process applied by the storage system 200 to storage objects, unless other criteria cause the storage system 200 to select another compression process.

FIG. 2 depicts the selection system 200 as separate from the storage operating system 260, but in alternate embodiments, the selection system 200 can be integrated into the storage operating system 260. The selection system 200 is described in greater detail in relation to FIG. 3.

The storage adapter 280 cooperates with the storage operating system 255 executing on the storage system 120 to access data requested by the server system 110. The data may be stored on the storage devices 125 that are attached, via the storage adapter 280, to the storage system 120 or other node of a storage system as defined herein. The storage adapter 280 includes input/output (I/O) interface circuitry that couples to the storage devices 125 over an I/O interconnect arrangement, such as a conventional high-performance, Fibre Channel serial link topology. In response to an access request received from a server system 110, data may be retrieved by the storage adapter 280 and, if necessary, processed by the CPU 275 (or the adapter 280 itself) prior to being forwarded over the system bus 270 to the network adapter 265, where the data may be formatted into a packet and returned to the server system 110.

The storage devices 125 may comprise disk devices that are arranged into a plurality of volumes, each having an associated file system. In some embodiments, the storage devices 125 comprise disk devices that are configured into a plurality of RAID (redundant array of independent disks) groups whereby multiple storage devices 125 are combined into a single logical unit (i.e., RAID group). In a typical RAID group, storage devices 125 of the group share or replicate data among the disks which may increase data reliability or performance. The storage devices 125 of a RAID group are configured so that some disks store striped data and at least one disk stores separate parity for the data, in accordance with a preferred RAID-4 configuration. However, other configurations, for example RAID-5 having distributed parity across stripes, RAID-DP, etc., are also contemplated. A single volume typically comprises a plurality of storage devices 125 and may be embodied as a plurality of RAID groups.

Figure 3:
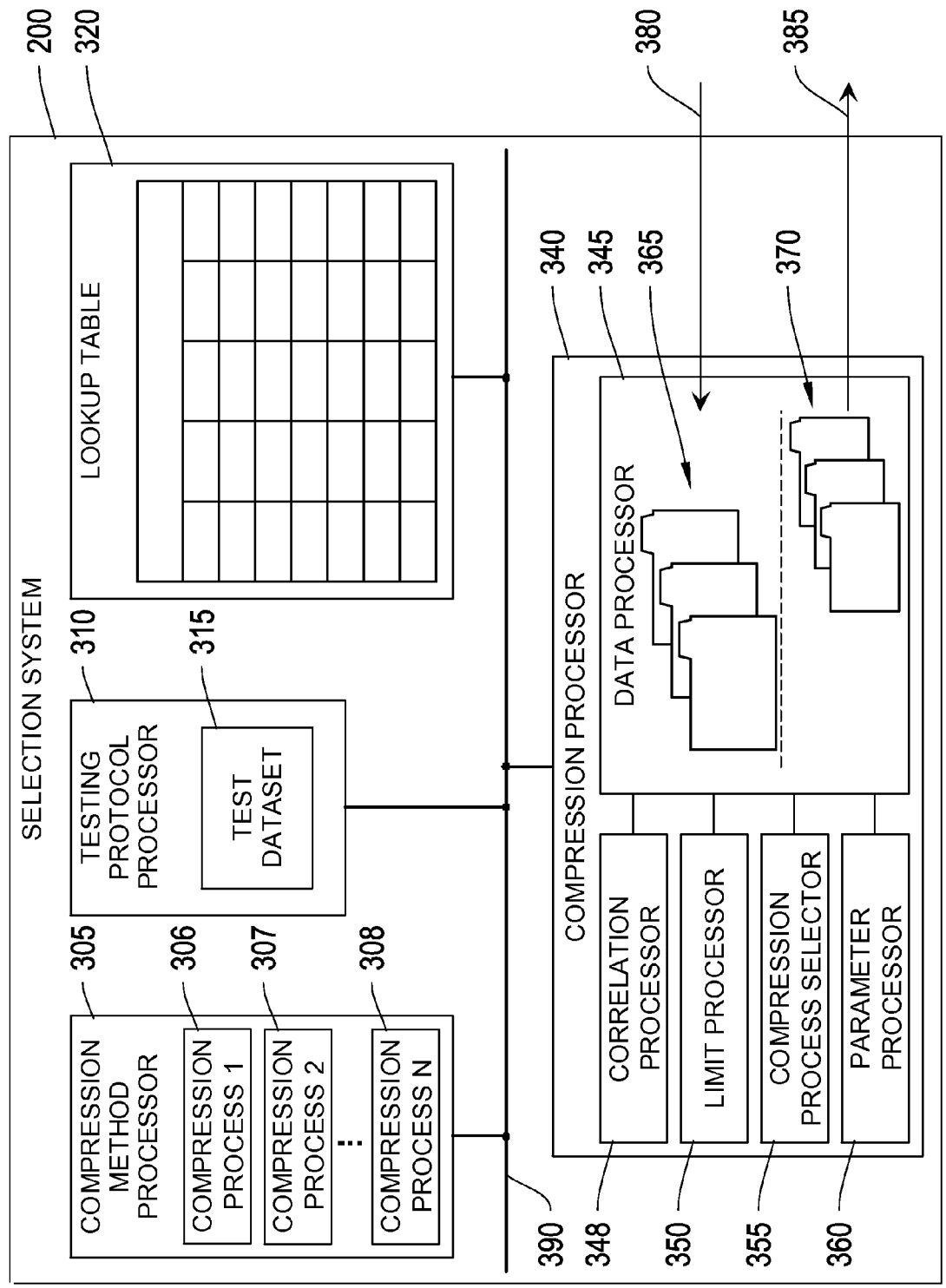
FIG. 3 is a schematic block diagram of an exemplary selection system environment in which some embodiments operate.

FIG. 3 is a schematic block diagram of an exemplary selection system 200 suitable for use with a storage system, such as, but not limited to, the storage systems depicted in FIGS. 1A and 1B. More particularly, FIG. 3 depicts a selection system 200 that includes an compression method processor 305 illustrated as having three compression processes 306, 307, 308, a testing protocol process 310 having a test dataset 315, a compression processor 340, having a data processor 345, a correlation processor 348, a limit processor 350, a compression process selector 355, a parameter processor 360, exemplary storage objects, in this case files, to be compressed 365, and exemplary compressed files 370. A lookup table data structure 320 is interconnected by data bus 390 to the compression processor 340. An input channel 380 and output channel 385 allow input and output to and from the selection system 200.

As will be described in more detail below, the selection system 200 selects a compression process for compressing a storage object, which in FIG. 3 is depicted as a data file, but can be any suitable storage object, for storage on to device 125. The selection system 200 shown in FIG. 3 includes a data memory, typically a random access memory but other memory devices may also be employed. The memory stores the lookup table 320 as a data structure. The lookup table data structure can be any suitable structured data set, and most commonly is a data structure created by an executing computer program and storing its data, at least in part, in a random access memory. Alternatively, the lookup table may be a database stored on a disk or other primary storage. The lookup table may store its data as data sets, as the parameters of an equation for calculating, including interpolating, certain values, or in any other suitable manner. Typically, the lookup table data structure 320 includes pointers, which can be any suitable reference, to a set of compression processes executing on the data processor 345 or stored within a memory that is accessible by the system 200. In the depicted embodiment, each compression process is also associated with a compression ratio metric and a data rate metric, both of which may be stored in the lookup table data structure 320, or in alternate data structures that can be referenced through the lookup table data structure 320.

The depicted selection system 200 includes the optional testing protocol processor 310 and the compression method processor 305 for applying the compression processes 306, 307 and 308, to some or all of the test data set 315 to determine compression rates for the compression processes 306-308. This compression rate data may be loaded into the lookup table data structure 320 for use by the compression processor 340 to compress actual data being stored. In other embodiments, the testing protocol processor 310 is omitted as is test data set 315, and the lookup table data structure 320 is populated with compression rates that were determined earlier and are now saved and stored for use in the lookup table data structure 320.

The compression method processor 305 in one embodiment integrates the source code of a plurality of coded compression processes, which in this example are the three depicted processes 306, 307, and 308, however any number of compression processes may be part of the compression method processor 305. In one embodiment, the compression processes 306, 307 and 308 are pointers to compression processes that implement a particular compression process and that may be called by and executed by the selection system 200 to compress or decompress a set of data, whether a data block, a set of data blocks, a file or some other storage object or data structure. In this embodiment, the compression processes are executable computer code stored in a library that is linked into a software process that implements the selection system 200. In one particular embodiment, the compression processes are commercially available executable computer processes, such as gzip, zpaq, or some other computer process, that carry out one or more compression processes, and that are maintained within an executable library. In any case, the compression processes 306, 307, 308 in the compression method processor 305 can be any suitable compression processes and optionally may achieve lossy or lossless compression. Lossless algorithms are typically employed for general-purpose compression that does not take file type into account, and lossy compression processes may be used when a specific file type is considered.

Testing protocol process 310 populates lookup table data structure 320 with results data that can be used to choose a compression process for real data submitted to the selection system 200. The testing protocol processor 310 applies a variety of compression processes from compression method processor 305, to a test dataset 315, using a plurality of compression process input parameters such as the sliding window size, the size for any hash tables, buffer size for strings, the dictionary size, specialty parameters such as the strategy parameter for the zlib compression process, or any other of the parameters that are adjustable for a compression process, such as gzip, NanoZip or any other compression process. The testing procedure, carried out by the testing protocol processor 310 involves compressing, and decompressing the test dataset 315. The test dataset 315 may consist of a variety of file types, including video, audio, image and text files, and the range and type of input parameters to be tested using the testing protocols are defined by a selection system 200 user, externally. The testing may be targeted to a test dataset 315 that includes a variety of file types to be compressed simultaneously by a general-purpose compression process, or a specific file type to be compressed by a specialized compression process. The testing results, saved by the testing protocol processor 310 in the lookup table 320, may also include, among others; the compression process, the input parameters used, the compression ratio achieved, the data compression and decompression rates, the file type tested on, the memory required to achieve the compression ratio, and metrics related to the CPU clock speed during compression and decompression, which can be described as the load placed upon the CPU. The lookup table 320 stores the results of the testing protocol processor 310, and the compression processor 340 can access the table 320 in response to a request for compression/decompression of a real storage object.

The compression processor 340 receives real data that has been submitted to the selection system 200, to be compressed or decompressed. More particularly, the data processor 345 receives data submitted to the selection system 200 by the storage system 120 via input channel 380. Depicted in FIG. 3 are files to be compressed 365, submitted to the compression processor 340, and received by the data processor 345. Typically, the data processor 345 receives the storage object, which in this illustration is a data file, and the object has an uncompressed size, which in this example will be the uncompressed size of the data file, such as the data files 365. Input channel 380 may be a physical data bus, or a logical data path within memory, and files or other data structures may be transferred over the input channel 380 for compression. In one embodiment, the data processor 345 can identify the file type, by using the file suffix, or by opening the file and looking at the file header. If a compression process selection is to be made based on file type, this information can be passed to the compression process selector 355. Note that the data processor 345 also identifies if the submitted data is already compressed.

In one embodiment, the data processor reviews header information in the file to identify metadata, such as file-type metadata, that indicates whether the file is compressed or includes embedded compressed files, such as compressed images. The limit processor 350 accepts user-specified inputs (otherwise referred to as operating parameters, or limits), which may include a data compression/decompression speed limit, a memory usage limit, specifying if the particular file type is to be considered in the selection of the algorithm, or a CPU power demand limit, among others. Where a speed limit is specified, this may be a minimum acceptable data rate that must be attained in compression or decompression, and is typically specified in units of kilobytes per second (KB/s) or equivalent, or alternatively as a total time to compress or decompress the file, specified in units of seconds (s), or equivalent. Where a total time limit is specified, the limit processor 350 calculates a corresponding minimum acceptable data rate, using the known file size. For example, if the user-specified time limit to compress a 6000 KB file is 1 minute, then the limit processor 350 computes the calculated minimum acceptable data rate to be 6000/60 KB/s, which equals 100 KB/s. These limits are passed to the compression process selector 355 which can use the limits as selection parameters that can be compared against data rates stored in the lookup table data structure 320 to narrow the scope of the algorithm selection.

The compression process selector 355 selects a compression process from the plurality of compression processes stored in the compression method processor 305, for use on data submitted to the selection system 200. The compression process selector 355 uses the limits specified by the limit processor 350 to narrow the compression process search. The compression process selector 355 can access the lookup table 320, and sort by application of a standard numeric sorting process, the stored computer processes based on the performance metrics stored by the testing protocol processor 310. A weighting system may be used to rank the metrics, whereby, during selection system 100 initialization, user-specified weights are applied to the metrics to be stored in the lookup table 320. These weights may, for example, rank the data decompression speed as the most important and therefore having the highest weight, the compression speed as second, the compression ratio achievable third, and the memory required for processing as fourth, and continue the ranking for as many metrics as there are stored in the table 320. During compression process selection, the corresponding algorithm search for this ranking may be the following: The compression process selector 355 first reduces the list of candidate compression processes based on whether the limit processor 350 required a selection for a specific file type, or a general purpose algorithm. The compression process selector 355 would subsequently excludes those algorithms that do not meet minimum decompression and compression speeds. Next, the compression process selector 355 excludes those algorithms that do not meet the lower limit of the third-ranked criterion, the compression ratio, and this exclusion process continues until all limits have been considered. If, after this exclusion process has been completed, there remains more than one suitable candidate compression process, the compression process selector 355 selects the candidate compression process that provides the highest compression ratio. If the number of candidate compression processes is reduced to zero at any step in the selection process, before or after all limits have been considered, the compression process selector 355 reverts back to the previous step, when there was at least one candidate compression process. If there is more than one candidate compression process at this regressed step, the compression process selector 355 chooses that one which can achieve the highest compression ratio. This selection process assumes that algorithms optimized for a particular file type will always be able to achieve compression ratios that are better, for that specific file type, than any general-purpose compression ratio.

The parameter processor 360 receives the selected compression process, such as compression process 306, from the compression method processor 355, and extracts the input parameters used to achieve the compression results stored in the lookup table 320. The data processor 345 applies the selected compression process 306 to the real data, using the parameters associated with the selected compression process from the lookup table 320. The compressed file, schematically shown as compressed files 370 within the data processor 345, may be passed back to the storage system, such as storage system 120, along output channel 385, where the output channel 385 may be a physical data bus, or a logical data path within memory.

Optionally, upon receipt of compressed data, the data processor 345 may request the compression process selector 355 to choose a compression process capable of decompressing the data. In one embodiment, the data processor 345 chooses the compression process by examining any file extension and file header data associated with the compressed data. If examining this data indicates a compression process to decompress the file, optionally the data processor 345 may verify that the correct process was selected by processing a portion of the compressed data and verifying whether the structure of the file of compressed data matches the expected file structure of a file compressed using the assumed compression process. If a match is found, then the data processor 345 proceeds, if no match is found, the data processor 345 aborts the process. Using the identified compression process, the data processor 345 performs a compression comparison check to determine if the data was compressed using a compression process that was equally, or more efficient than the available compression processes in the compression method processor 305. If the compression process used before the submission of the data to the selection system 200 is less effective than an option available to the selection system 200, the data is decompressed, and recompressed using the compression process selected with the aforementioned methodology.

In one further optional embodiment, before performing a compression on a data file, the algorithm selection process 365 may employ a compression estimation process to estimate the compression ratio that will achieved by compressing a data file with the selected compression process. The algorithm selection process 365 employs the compression estimation process to estimate whether the selected compression process, which may take more time and system resources, is likely to provide a compression ratio that is higher than a less resource intensive compression process. Certain compression processes have data compression rates that are comparable to the I/O data rate of a storage operation. Such a compression process may be considered a fast compression process. Typically, a compression rate may be considered comparable to the I/O rate of a storage device if the compression process can compress a data file in the same amount of time that the storage device requires to store the data file, or is about twice the amount of time to store the data file, and in some cases is about ten times the amount of time needed to store the data file. Thus a fast compression process can compress a data file in about ten times the time period needed to perform the I/O for storing the data file or less. Compression processes that have lower data compression rates may be considered slow compression processes. As noted above, a slow compression process may have the potential to achieve a greater compression ratio than a fast compression process, but the actual compression ratio achieved can vary depending upon characteristics of the data file being compressed. The compression processor 340 may correlate slow compression process performance to fast compression process performance, such that a fast compression process compression ratio can be used to predict the compression ratio that may be achieved using a slower compression process, and for an unknown file type, or complex file type that was not considered by the testing protocol processor 310 during the population of lookup table 320, wherein a complex file may include embedded files, such as .jpeg files embedded in a .doc file.

Compression processes adapted to achieve higher compression ratios require increased run-time. A slow compression process, however, is not guaranteed to achieve high compression ratios. Not to be bound by theory, but the compression process analyzes and manipulates the raw data in a file or other storage object to identify, typically, patterns and/or redundancy that can be reduced or eliminated. The effectiveness of a particular compression process will turn, at least in part, on the data that makes up the data file. For example, data files may include previously-compressed embedded files, such as audio, video and image files. It is often the case that those compressed files were compressed during creation of the data file using a compression process intrinsic to the software application that created the file. Typically, the compression processor 340 cannot reverse the earlier performed compression of the embedded file. This inability to reverse the earlier compression reduces the compression processor's 340 ability to further compress the data file. An example may include a first Microsoft Word document, a .doc file, that is made up primarily of embedded compressed images, such as .jpeg images, and a second .doc file made up primarily of text. Since a .jpeg is a compressed file type, the compression ratio that can be achieved on the first .doc file will typically be less than that for the second .doc file. Accordingly, the application of a computationally intensive compression process to the first file may not yield a significant improvement in compression ratio over a faster and less computationally intense compression process.

As such, in certain embodiments the compression processor 340 applies a prediction process to predict the compression ratio that may likely be achieved using the selected slow compression process, rather than first spending the computational time to compress a file using a slow compression process, only to achieve marginal compression ratio gains over a fast process. In one implementation, this prediction may be accomplished using a correlation function between a fast compression process and a slow compression process, calculated by a correlation processor 348, and stored in lookup table 320. A correlation function is calculated using results produced by a testing protocol processor 310, wherein a test dataset 315, which includes a plurality of different file types, is compressed using a plurality of different compression processes. These compression processes may include fast processes that achieve low compression ratios, and slow processes that achieve high compression ratios.

In particular, the correlation processor 348 may associate two compression processes with a set of compression result-pairs, wherein a compression result-pair is formed by the correlation processor 348 as the set of the two compression ratios calculated for the two compression processes on the same file (storage object), and wherein this file may be one of a plurality within the test dataset 315.

The correlation processor 348 may store a plurality of compression result-pairs for a given combination of two compression processes, and use two or more of these compression result-pairs to calculate a correlation function relating one of the two compression processes to the other compression process.

The correlation processor 348 may also compare the time taken to compress a file, or group of files, from the test dataset 315, and determine that one of the two compression processes is a fast compression process when compared to the second of the two compression processes, if the difference in time taken to complete compression by the two compression processes is above a certain threshold, which may be user-defined.

Given a fast compression process and a slow compression process, the correlation processor 348 can be used to calculate a correlation function that expresses a relationship between the two compression processes in the form:

$$CR\_slow = f(CR\_fast)$$

Where CR_slow represents the compression ratio of the slow compression process, CR_fast represents the compression ratio of a fast compression process; and f( ) represents the calculated correlation function.

The correlation function states that the compression ratio that may be achieved by a slow compression process, or CR_slow, may be predicted as a function of the compression ratio achieved by a fast compression process, or CR_fast. One example of a correlation process is discussed below with reference to FIG. 9. However, other techniques and methods may be employed to derive the correlation in function and any of these techniques may be employed with the systems and methods described herein. The correlation processor 348 also calculates a coefficient of determination, $R^2$, as a measure of the strength of the correlation between a first and a second compression process, wherein a coefficient of determination equal to 1.0 represents a perfect correlation, and the correlation function corresponding to this coefficient of determination can be used to predict, with certainty, the compression ratio of the second compression process, using the compression ratio of the first compression process, between the upper and lower limits of the data points used to calculate the correlation function. An imperfect coefficient of determination has a value less than 1.0, and a user-defined value of the coefficient of determination may be used to decide if a given correlation function is "strong", and wherein a strong correlation allows the results of a second compression process to be predicted using a first compression process with an acceptable level of confidence. A user-defined coefficient of determination value less than 1.0, wherein the value may be, for example, 0.9, may be used as a threshold, above which the correlation between the first and the second compression process is determined to be strong.

By storing the relationship between two compression ratios as a function, rather than a series of data points, the large result-set calculated by testing protocol processor 310 need not be retained within long-term memory of the selection system 200. The correlation function also offers the advantage of being able to predict compression ratios for unknown file types, and for complex scenarios wherein files are embedded within others, such as .jpeg files in .doc files.

Upon submission of actual data files to be compressed 365 to the data processor 345 on input channel 380, the data processor 345 may test this data file to predict the compression ratio that may be achieved using a slow compression process. The data processor 345 may choose to compress a subset, or optionally, all of the real data using a fast compression process selected by compression process selector 355.

Optionally, using a first compression ratio result achieved using the fast compression process, the data processor 345 can use a correlation function, stored in lookup table 320, to estimate the compression ratio that may be achieved using a slow compression process, wherein examples of fast compression processes include LZO and Snappy, and examples of slow compression processes include NanoZip and 7-Zip.

Further, using the expected compression ratio result of the correlation function, the data processor 345 may determine to apply the slower compression process to the data to be compressed. This determination may be based on a number of limits, or compression rules, which may include, among others, that a compression process should not be used if it will result in marginal compression ratio improvements such as less than a fifty percent improvement, a hundred percent improvement, or some other user specified threshold, over a different compression process that takes less time to run or less system resources. The compression rules are stored in limit processor 350, and may be user-specified, or constant within the selection system 200.

Figure 4A:
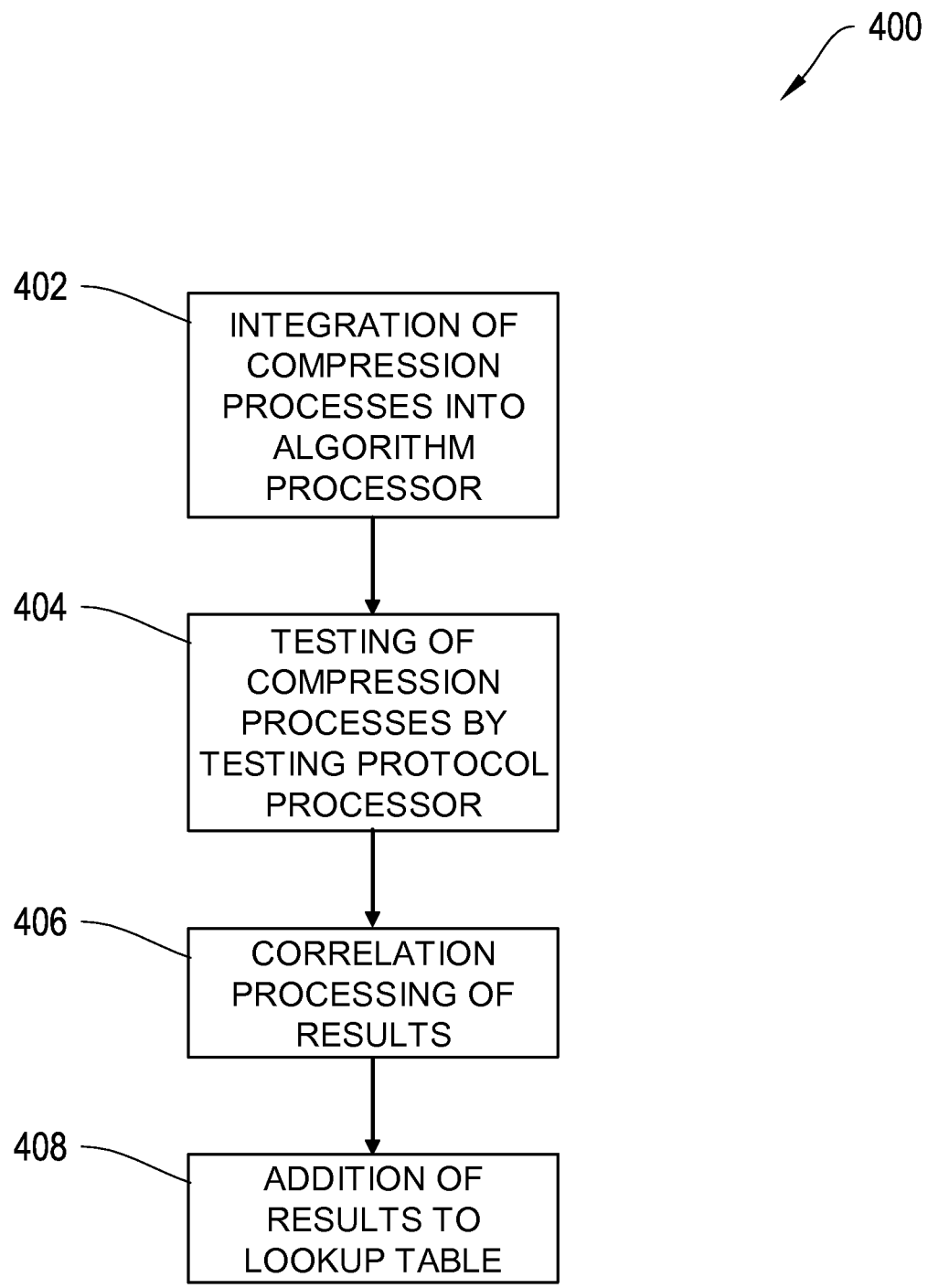
FIGS. 4A and 4B are flow chart diagrams of processes for testing and selecting compression processes, respectively, as described herein with reference to the selection system environment of FIG. 3.
Figure 4B:
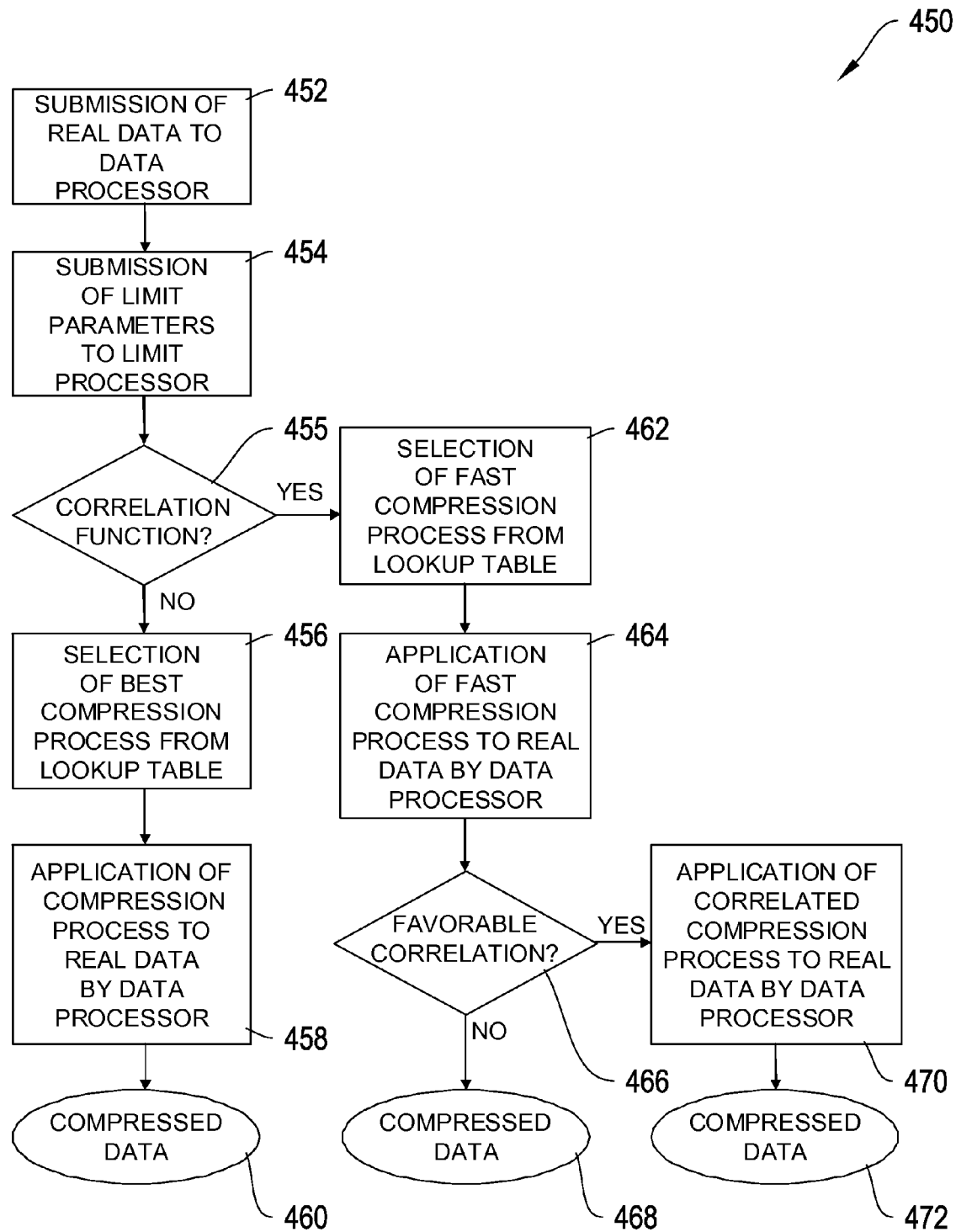

FIGS. 4A and 4B depict a method 400 for testing a plurality of compression processes for use in a compression process selection system, and a method 450 for selecting a compression process, using a compression process selection system, respectively. Methods 400 and 450 are described herein with reference to the selection system environment of FIG. 3

The method 400 of FIG. 4A starts at step 402 with the integration of a plurality of compression processes into a compression method processor, wherein the compression processes may be adapted to work with a specific file type, or may be suitable for a plurality of files types. Step 402 includes the provision of a test dataset for testing the plurality of compression processes using a testing protocol processor.

The method 400 proceeds to step 404, wherein the testing protocol processor tests a plurality of compression processes in the compression method processor using a plurality of input parameters and files types. The testing protocol processor may be used to determine the compression and decompression performance of general-purpose and specialized compression process variants.

Step 406 represents an optional calculation, by a correlation processor, of correlation functions between the compression ratios that may be achieved by the compression processes stored in the compression method processor. The correlation processor calculates the mathematical relationship between the results of a first and the results of a second compression process, and calculates a coefficient of determination as a measure of the strength of the correlation between the first and second compression processes, wherein if the coefficient of determination is above a threshold value of, for example, 0.9, the correlation function is determined to be sufficiently strong.

The method 400 ends with step 408, wherein the results from the testing protocol processor, and the correlation functions calculated by the correlation processor that are of sufficient strength, are store in a lookup table.

The method 450 for selecting a compression process in FIG. 4B starts at step 452 wherein real data is submitted to the data processor for compression. Step 454 represents the submission of limit parameters corresponding to the real data, wherein the limit parameters may include a minimum acceptable data compression or decompression speed limit, a minimum compression ratio, a maximum amount of RAM that may be used during compression or decompression, or a maximum acceptable CPU load, among others.

Step 455 represents a check which determines whether a correlation function will be used in the selection of a compression process. If a correlation function is not used, the method 450 proceeds to step 456, wherein step 456 is a compression process selection step. Upon receipt of data to be compressed or decompressed, the data processor identifies the data type, and passes this information to the compression process selector. The compression process selector uses the limit parameters and file type information to select the best compression process available from the lookup table. Upon selection of the best available algorithm, the parameter processor extracts, from the lookup table, the input parameters used to achieve the best compression of the test dataset.

The data processor accesses the source code of the selected compression process at step 458, and implements the selected compression process on the real data, using the input parameters supplied by the parameter processor. This results in the real data being compressed, using the best available compression process, to compressed data at step 460.

If the data processor does not recognize the file type of the data submitted to the data processor at step 452, or if the file type is determined to be complex, such as including embedded files within a main file, the data processor may use a correlation function to test the data, and the check at step 455 takes the path to step 462.

Step 462 is a selection step for a fast compression process. Upon receipt of data to be compressed or decompressed, the data processor identifies the data type, and passes this information to the compression process selector. The compression process selector uses the limit parameters and file type information to select a fast compression process that can be correlated to a slow compression process with a higher expected compression ratio.

The data processor accesses the source code of the selected fast compression process at step 464, and implements the selected fast compression process on the real data, using the input parameters supplied by the parameter processor.

Step 466 checks if the compression ratio achieved on the real data using the fast compression process correlates to a favorable compression ratio for a slower compression ratio, using a correlation function from the lookup table, and wherein the criteria for a favorable correlation are user-defined. The criteria may include, for example, that a compression ratio achieved using a slow compression algorithm should be at least four times greater than that using a fast compression ratio, among others.

If the correlation function predicts a non-favorable increase in compression ratio with the use of a slow compression process, method 450 proceeds to step 468, and the real data is compressed using the fast compression process alone.

If the correlation function predicts a favorable increase in compression ratio by using a slow compression process, the method continues to step 470, and the data processor accesses the source code of the correlated slow compression process, and implements the correlated slow compression process on the real data, using the input parameters supplied by the parameter processor, resulting in the compressed data at step 472.

Figure 5:
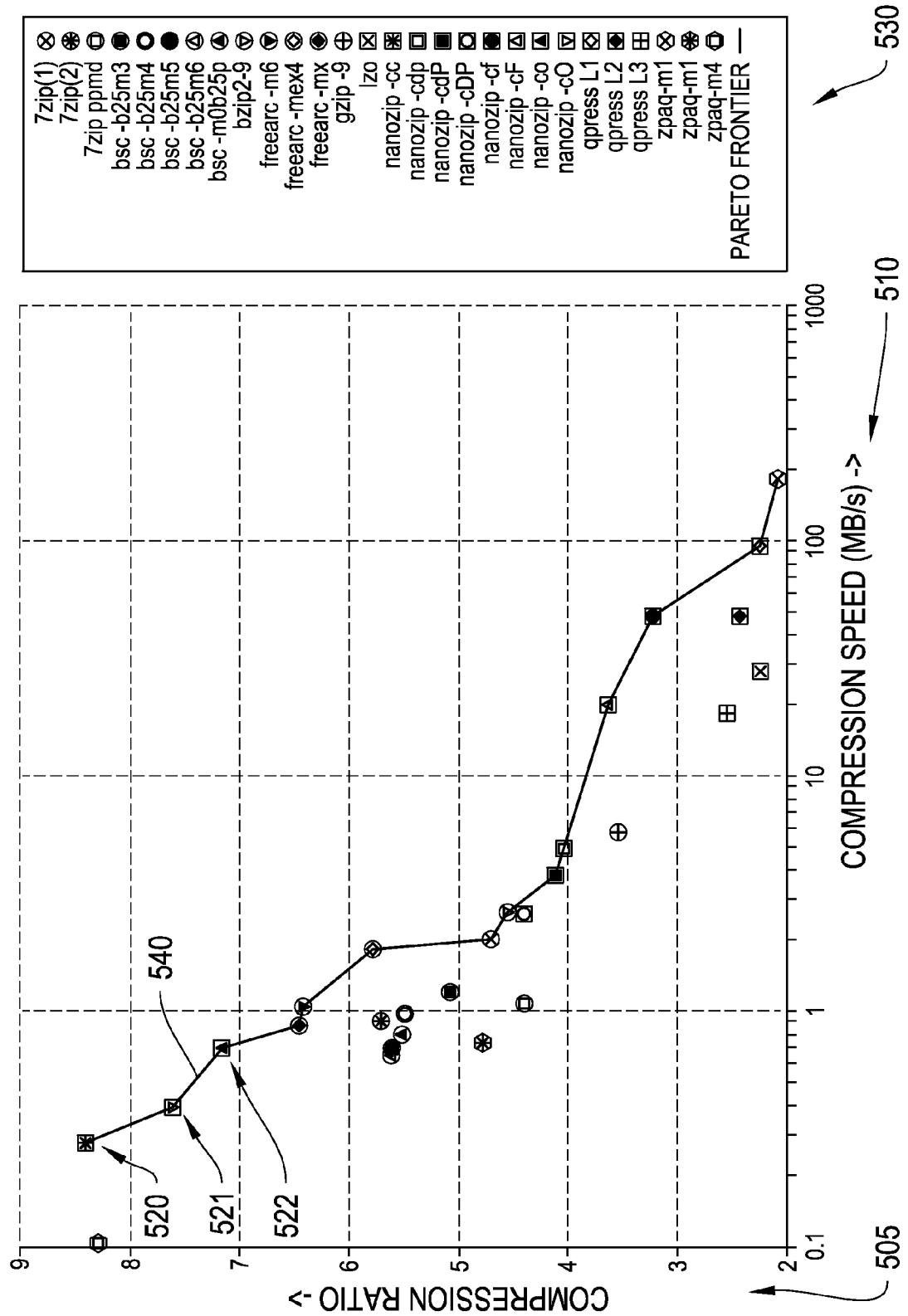
FIG. 5 depicts test data comparing compression ratios for a plurality of compression processes, against compression speed.
Figure 7:
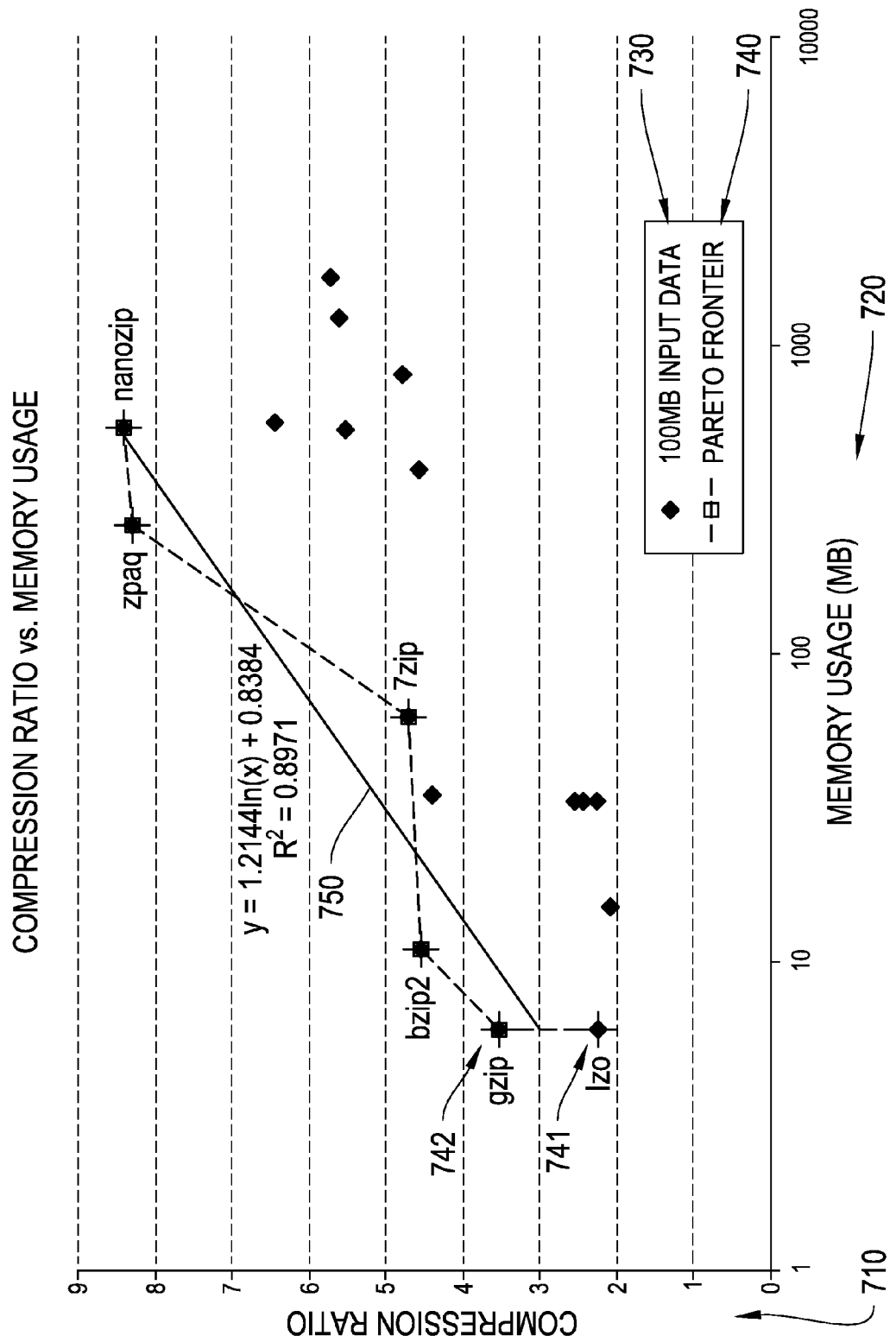
FIG. 7 depicts test data comparing compression ratios against memory usage.

FIGS. 5, 6, 7 and 8 depict the results of testing carried out to verify that a testing protocol, such as testing protocol processor 310 from FIG. 3, using a test dataset, such as test dataset 315, can be used to effectively predict the compression efficiency achievable for real data. FIGS. 5, 6 and 7 represent results from a test dataset that included raw video files, email folders, and image files amounting to 18 GB in size. The tests also include 15 different open-source, lossless compression processes, including 7-Zip, FreeArc, bsc (a block-sorting compression process), bZIP, Gzip, NanoZip, qpress, Snappy, ZPAQ, and variations thereof.

FIG. 5 depicts test data comparing compression ratios achieved by a plurality of compression processes against the compression speed required to achieve those compression ratios. In particular, FIG. 5 depicts compression ratios on a y-axis 505 ranging from values of 2 to 9, against compression speeds, with units of megabytes per second (MB/s), on an x-axis 510, and wherein the x-axis 510 ranges from 0.1 MB/s to 1000 MB/s. The plotted data points, such as points 520, 521, and 522, represent the compression ratio and compression speed test results of a specific compression process, and the compression processes corresponding to the data points 520, 521, 522 etc. are listed in a key 530. A Pareto Frontier 540 shows a trend in the data points, whereby there is an exponential increase in time required to achieve an incremental improvement in compression ratio. This same trend is also observed for data points that plot compression ratio versus decompression speed.

FIG. 6 depicts test data comparing compression ratios for two compression processes against a plurality of file types. In particular, FIG. 6 depicts compression ratio 610 on a y-axis, ranging from a value of 0 to 40, versus a number of different file types, such as file type 640, which is a bitmap file, and represented by its file suffix "bmp", which is well known in the art. For each file type, the depicted data compares the compression ratio that can be achieved by two compression processes, NanoZip 620, and 7zip 630.

Expanding upon FIG. 5, FIG. 6 depicts results that indicate that the file type has an impact on the compression performance of an algorithm. For certain file types, such as bitmap files 640, the compression ratio 641 that can be achieved using NanoZip 620 is less than the compression ratio 642 using 7zip 630. For other file types, such as cad files 650, NanoZip 620 achieves a higher compression ratio 651 than that compression ratio 652 achieved using 7zip 630. These results indicate that the choice of a compression process specially adapted to a particular file type can increase compression performance.

FIG. 7 depicts test data comparing compression ratios against memory usage, for a plurality of compression processes. In particular, FIG. 7 depicts compression ratios on y-axis 710, ranging from values of 0 to 9, and memory usage on x-axis 720 ranging from values of 1 to 10000 megabytes (MB), and a wherein memory usage value refers to the amount of system memory, or RAM, needed to compress 100 MB of input data.

The compression results are plotted such that each point represents a compression ratio and corresponding memory usage value, for a specific compression process. Points 741 and 742 are examples of points selected as Pareto Frontier data points, wherein Pareto Frontier points are chosen as those with the best combination of high compression ratio and low memory usage. A trend line 750 is drawn between the Pareto Frontier points, which indicates that there is an exponential increase in RAM required to achieve an incremental increase in compression ratio of a compression process.

FIGS. 5, 6, and 7 are representative of a larger body of testing data used to populate a lookup table, such as lookup table 320 from FIG. 3. Such a lookup table stores data relating the performance of a given compression process using metrics which include, but are not limited to, those depicted in FIGS. 5, 6, and 7; compression data rate, file type, and memory usage. A further set of testing was carried out to verify that the lookup table formed from the test results included in FIGS. 5, 6, and 7 is reliable.

Figure 8:
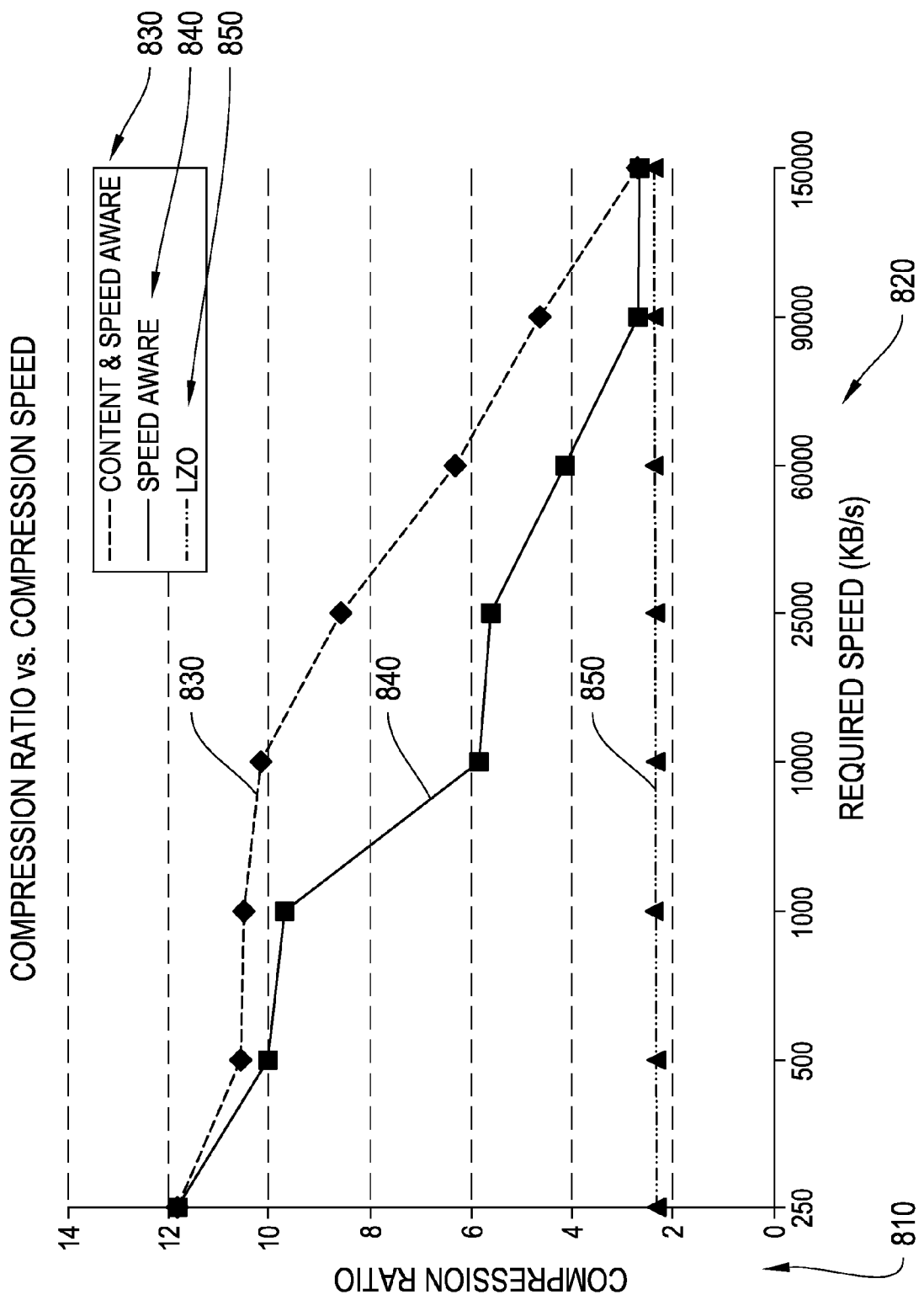
FIG. 8 depicts test data that aggregates compression ratios of certain compression processes against required compression speeds.

FIG. 8 depicts test data that aggregates compression ratios against required compression speeds of the best available compression process. The graphs shown in FIG. 8 represent results from a real data, wherein the real dataset used was larger than that used to populate the results lookup table. In this instance, 60 GB of data was used. In particular, FIG. 8 depicts a compression ratio axis 810, which ranges from a value of 0 to 14, and a required speed axis 820, which ranges from 250 to 150000 kilobytes per second (KB/s).

Given a minimum acceptable data compression rate, or required speed, in megabytes per second (MB/s), a system, such as selection system 200, selects the best available compression process, and uses that compression process to compress the 60 GB of data. FIG. 8 compares the results of a general-purpose compression process, the LZO process 850 which is capable of achieving high compression speeds, to those compression processes that meet the minimum compression speed limits and maximize the compression ratio, depicted as Speed aware compression processes 840. The results further include results from tests that consider both the file type and the minimum acceptable compression ratio as Content & Speed aware results 830.

The results in FIG. 8 for speed aware compression processes 840 indicate that, if increased compression times can be tolerated, there exist compression processes capable of better compression ratio performance than those that can achieve the fastest compression speeds. If, in addition to allowing the minimum data compression rate to decrease, the selection system 200 considers the specific file type in the selection of a compression process, then further increases in compression ratio can be achieved, as depicted in Content and Speed aware results 830 that show, for a given required compression speed, an increase in compression ratio achieved over the Speed aware results 840.

Figure 9:
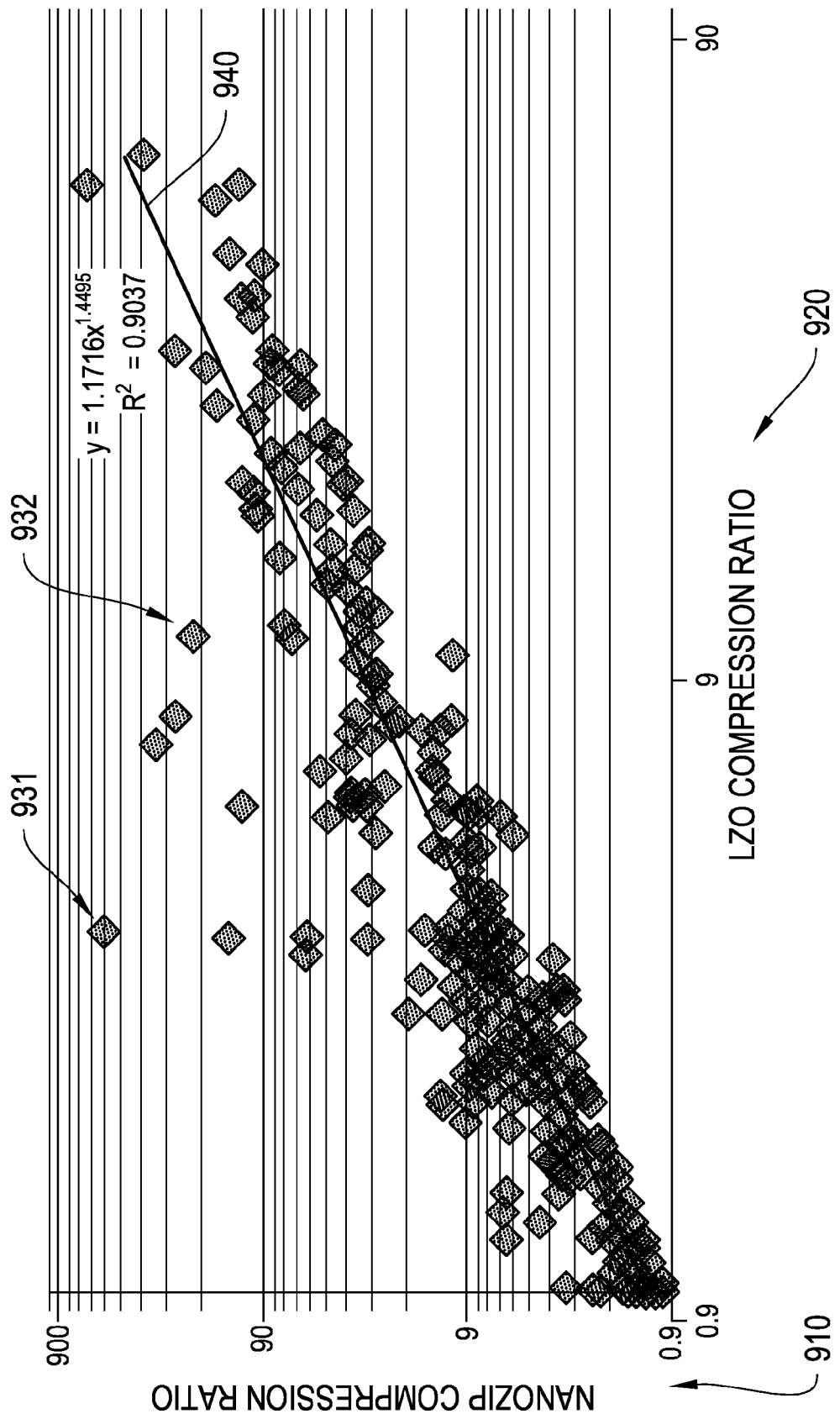
FIG. 9 depicts one example of a correlation function fitted to test data.

FIG. 9 depicts a correlation function fitted to test data. In particular, FIG. 9 depicts results of compression tests, run by testing protocol processor 310, and using a variety of file types, where each data point, such as data points 931 and 932, in FIG. 9 represents a different file type. Compression ratio results for NanoZip are depicted on y-axis 910, which ranges from 0.9 to 900, and results for LZO on x-axis 920, ranging from 0.9 to 90. The results compare the compression ratios that may be achieved by a slow compression process (NanoZip), versus a fast compression process (LZO), wherein a data point represents the same file compressed by both processes.

A curve fitting operation, implemented by correlation processor 348, calculates the mathematical relationship, or correlation function, between the results of the two processes in the form:

$$CR\_slow = f(CR\_fast)$$

The correlation function is a mathematical expression, which states that the compression ratio that may be achieved by a slow compression process, or CR_slow, is a function of the compression ratio achieved by a fast compression process, or CR_fast, and in FIG. 9 is expressed as:

$$NanoZip\_compression\_ratio = 1.1716 \times (LZO\_compression\_ratio)^{1.4495}$$

The correlation processor 348 also calculates a coefficient of determination, with symbol $R^2$, as a measure of the how well the compression function approximates the test data. In FIG. 9, the coefficient of determination is 0.9037, and the coefficient has a value unity, or 1.0, for a perfect correlation function fit to the test data.

The correlation function is stored in lookup table 320, which may be consulted during an algorithm selection operation to determine if it is beneficial to apply a slow compression ratio to real data to be compressed.

Some embodiments of the above described may be conveniently implemented using a conventional general purpose or a specialized digital computer or microprocessor programmed according to the teachings herein, as will be apparent to those skilled in the computer art. Appropriate software coding may be prepared by programmers based on the teachings herein, as will be apparent to those skilled in the software art. Some embodiments may also be implemented by the preparation of application-specific integrated circuits or by interconnecting an appropriate network of conventional component circuits, as will be readily apparent to those skilled in the art. Those of skill in the art would understand that information and signals may be represented using any of a variety of different technologies and techniques. For example, data, instructions, requests, information, signals, bits, symbols, and chips that may be referenced throughout the above description may be represented by voltages, currents, electromagnetic waves, magnetic fields or particles, optical fields or particles, or any combination thereof.

Some embodiments include a computer program product comprising a computer readable medium (media) having instructions stored thereon/in and, when executed (e.g., by a processor), perform methods, techniques, or embodiments described herein, the computer readable medium comprising sets of instructions for performing various steps of the methods, techniques, or embodiments described herein. The computer readable medium may comprise a storage medium having instructions stored thereon/in which may be used to control, or cause, a computer to perform any of the processes of an embodiment. The storage medium may include, without limitation, any type of disk including floppy disks, mini disks (MDs), optical disks, DVDs, CD-ROMs, micro-drives, and magneto-optical disks, ROMs, RAMs, EPROMs, EEPROMs, DRAMs, VRAMs, flash memory devices (including flash cards), magnetic or optical cards, nanosystems (including molecular memory ICs), RAID devices, remote data storage/archive/warehousing, or any other type of media or device suitable for storing instructions and/or data thereon/in. Additionally, the storage medium may be a hybrid system that stored data across different types of media, such as flash media and disc media. Optionally, the different media may be organized into a hybrid storage aggregate. In some embodiments different media types may be prioritized over other media types, such as the flash media may be prioritized to store data or supply data ahead of hard disk storage media or different workloads may be supported by different media types, optionally based on characteristics of the respective workloads. Additionally, the system may be organized into modules and supported on blades configured to carry out the storage operations described herein.

Stored on any one of the computer readable medium (media), some embodiments include software instructions for controlling both the hardware of the general purpose or specialized computer or microprocessor, and for enabling the computer or microprocessor to interact with a human user and/or other mechanism using the results of an embodiment. Such software may include without limitation device drivers, operating systems, and user applications. Ultimately, such computer readable media further includes software instructions for performing embodiments described herein. Included in the programming (software) of the general-purpose/specialized computer or microprocessor are software modules for implementing some embodiments.

Accordingly, it will be understood that the invention is not to be limited to the embodiments disclosed herein, but is to be understood from the following claims, which are to be interpreted as broadly as allowed under the law.

Those of skill would further appreciate that the various illustrative logical blocks, modules, circuits, techniques, or method steps of embodiments described herein may be implemented as electronic hardware, computer software, or combinations of both. To illustrate this interchangeability of hardware and software, various illustrative components, blocks, modules, circuits, and steps have been described herein generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the embodiments described herein.

The various illustrative logical blocks, modules, and circuits described in connection with the embodiments disclosed herein may be implemented or performed with a general-purpose processor, a digital signal processor (DSP), an application-specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The techniques or steps of a method described in connection with the embodiments disclosed herein may be embodied directly in hardware, in software executed by a processor, or in a combination of the two. In some embodiments, any software module, software layer, or thread described herein may comprise an engine comprising firmware or software and hardware configured to perform embodiments described herein. In general, functions of a software module or software layer described herein may be embodied directly in hardware, or embodied as software executed by a processor, or embodied as a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read data from, and write data to, the storage medium. In the alternative, the storage medium may be integral to the processor. The processor and the storage medium may reside in an ASIC. The ASIC may reside in a user device. In the alternative, the processor and the storage medium may reside as discrete components in a user device.

We claim:

1. A method for determining a relationship between two compression processes, comprising:

compressing, by a compression processing computing device and a first compression process, at least a portion of a storage object and, by a second compression process, at least another portion of the storage object;

calculating, by the compression processing computing device, a compression result-pair comprising a first compression ratio achieved by the first compression process and a second compression ratio achieved by the second compression process;

determining, by the compression processing computing device, a speed difference between a compression performance of the first and the second compression processes;

when the speed difference exceeds an established threshold, calculating, by the compression processing computing device, a correlation function using at least two compression result-pairs comprising the compression result-pair and another compression result-pair calculated using the first and second compression processes and another storage object;

calculating, by the compression processing computing device, a coefficient of determination to determine the goodness of the calculated correlation function; and storing, by the compression processing computing device and in a lookup table, the correlation function, when the coefficient of determination exceeds another established threshold.

2. The method as set forth in claim 1, wherein the lookup table includes, for each of a plurality of respective compression processes including the first and the second compression processes, one or more compression rates, one or more compression ratios, or one or more associated resource limits.

3. The method as set forth in claim 1, wherein the storage object comprises a data file and the method further comprises identifying, by the compression processing computing device, a file type associated with the data file based at least in part on a file suffix associated with the data file or a file header within the data file.

4. The method as set forth in claim 3, further comprising selecting, by the compression processing computing device, the first and the second compression processes based on the identified file type.

5. A non-transitory computer readable medium having stored thereon instructions for determining a relationship between two compression processes comprising executable code which when executed by a processor, causes the processor to perform steps comprising:

compressing, by a first compression process, at least a portion of a storage object and, by a second compression process, at least another portion of the storage object;

calculating a compression result-pair comprising a first compression ratio achieved by the first compression process and a second compression ratio achieved by the second compression process;

determining a speed difference between a compression performance of the first and the second compression processes;

when the speed difference exceeds an established threshold, calculating a correlation function using at least two compression result-pairs comprising the compression result-pair and another compression result-pair calculated using the first and second compression processes and another storage object, calculating a coefficient of determination to determine the goodness of the calculated correlation function; and storing, in a lookup table, the correlation function, when the coefficient of determination exceeds another established threshold.

6. The non-transitory computer readable medium as set forth in claim 5, wherein the lookup table includes, for each of a plurality of respective compression processes including the first and the second compression processes, one or more compression rates, one or more compression ratios, or one or more associated resource limits.

7. The non-transitory computer readable medium as set forth in claim 5, wherein the storage object comprises a data file, the medium further having stored thereon at least one additional instruction comprising executable code which when executed by the processor, causes the processor to perform at least one additional step comprising identifying a file type associated with the data file based at least in part on a file suffix associated with the data file or a file header within the data file.

8. The non-transitory computer readable medium as set forth in claim 7, further having stored thereon at least one additional instruction comprising executable code which when executed by the processor, causes the processor to perform at least one additional step comprising selecting the first and the second compression processes based on the identified file type.

9. A compression processing computing device, comprising a processor and a memory coupled to the processor, wherein the processor is configured to be capable of executing programmed instructions that are stored in the memory and comprise:

compressing, by a first compression process, at least a portion of a storage object and, by a second compression process, at least another portion of the storage object;

calculating a compression result-pair comprising a first compression ratio achieved by the first compression process and a second compression ratio achieved by the second compression process;

determining a speed difference between a compression performance of the first and the second compression processes;

when the speed difference exceeds an established threshold, calculating a correlation function using at least two compression result-pairs comprising the compression result-pair and another compression result-pair calculated using the first and second compression processes and another storage object;

calculating a coefficient of determination to determine the goodness of the calculated correlation function; and storing, in a lookup table, the correlation function, when the coefficient of determination exceeds another established threshold.

10. The device as set forth in claim 9, wherein the lookup table includes, for each of a plurality of respective compression processes including the first and the second compression processes, one or more compression rates, one or more compression ratios, or one or more associated resource limits.

11. The device as set forth in claim 9, wherein the storage object comprises a data file and the processor is further configured to be capable of executing at least one additional programmed instruction that is stored in the memory and comprises identifying a file type associated with the data file based at least in part on a file suffix associated with the data file or a file header within the data file.

12. The device as set forth in claim 11, wherein the processor is further configured to be capable of executing at least one additional programmed instruction that is stored in the memory and comprises selecting the first and the second compression processes based on the identified file type.

* * * * *